United States Patent [19]

Shimada

[11] Patent Number: 4,853,930
[45] Date of Patent: Aug. 1, 1989

[54] ERROR-CORRECTING BIT-SERIAL DECODER

[75] Inventor: Michio Shimada, Tokyo, Japan

[73] Assignee: NEC Corporation, Tokyo, Japan

[21] Appl. No.: 99,801

[22] Filed: Sep. 22, 1987

[30] Foreign Application Priority Data

Sep. 22, 1986 [JP] Japan .................................. 61-225403
Dec. 22, 1986 [JP] Japan .................................. 61-303941

[51] Int. Cl.⁴ ............................................ G06F 11/10
[52] U.S. Cl. ..................................................... 371/43
[58] Field of Search ............................... 371/43, 44, 45

[56] References Cited

U.S. PATENT DOCUMENTS

| | | | |
|---|---|---|---|
| 3,665,396 | 5/1972 | Forney, Jr. ............................. | 371/43 |
| 4,291,406 | 9/1981 | Bahl et al. .............................. | 371/44 |
| 4,539,684 | 9/1985 | Kloker .................................... | 371/45 |

Primary Examiner—Charles E. Atkinson
Attorney, Agent, or Firm—Sughrue, Mion, Zinn, Macpeak & Seas

[57] ABSTRACT

In an encoder replica of a decoder for an input code sequence which corresponds to a code symbol sequence comprising an information symbol sequence and a redundancy bit sequence, a one-bit memory (46) successively memorizes consecutive bits of the input code sequence as memorized bits. An output circuit (62) delivers replica output bits in bit series to a sequential decode controller (43) in response to the memorized bits. In response to the memorized bits and a control signal produced by the controller in response to the input code sequence and the replica output bits, the encoder replica decodes the input code sequence into a reproduction of the information symbol sequence. Preferably, the output circuit is controlled by a position counter (64) giving separate indication of bits corresponding in the input code sequence to the information symbol sequence and of bits corresponding in the input code sequence to the redundancy bit sequence. More preferably, a synchronism shift counter corrects the separate indication in consideration of a shift in synchronism of the separate indication relative to the input code sequence.

9 Claims, 5 Drawing Sheets

ERROR-CORRECTING BIT-SERIAL DECODER

BACKGROUND OF THE INVENTION

This invention relates to an error-correcting decoder for use as a counterpart of an error-correction encoder.

In the manner which will later be described more in detail, an error-correction encoder is for use in encoding an information symbol sequence into a code symbol sequence which comprises the information symbol sequence and a redundancy bit sequence in accordance with a predetermined rule. The code symbol sequence is either transmitted to a transmission channel or route or stored in a storage medium.

Either transmitted through the transmission channel or reproduced from the storage medium, the code symbol sequence is supplied to a counterpart error-correcting decoder as an input code sequence. When compared with the code symbol sequence produced by the encoder, the input code sequence may have an error or errors mainly due either to noise in the transmission channel or to physical defects of the storage medium. Regardless of presence and absence of such an error, it is possible to understand that the input code sequence corresponds to the code symbol sequence. The redundancy bit sequence is used in the decoder in automatically correcting the error or errors. Correcting the error or errors, the decoder decodes the input code sequence into a decoded symbol sequence which gives a reproduction of the information symbol sequence.

It will also be described more in detail later in the following that a conventional error-correcting decoder comprises an encoder replica responsive to the input code sequence for producing a replica output signal with reference to the predetermined rule and a sequential decode controller for executing a sequential decoding algorithm on the input code sequence and the replica output signal to produce a control signal. Controlled by the control signal, the encoder replica decodes the input code sequence into the above-mentioned decoded symbol sequence.

The sequential decoding algorithm has been executed on the input code sequence and the replica output signal on a symbol by symbol or code by code basis. It has now been confirmed as will become clear as the description proceeds that the prior art error-correcting decoder has a slow decoding speed as a result of execution of the sequential decoding algorithm on such a symbol by symbol basis when each information symbol of the information symbol sequence has a long bit or symbol length. On the other hand, it is highly desirable to deal with a great amount of data or information at a high speed with no error in the present-day information-intensive social system which is realized by a combination of electrical and/or optical communication systems and electronic digital computers.

SUMMARY OF THE INVENTION

It is therefore an object of the present invention to provide an error-correcting decoder which has a high decoding speed even for an input code sequence wherein each information symbol has a long bit length.

It is another object of this invention to provide an error-correcting decoder of the type described, which comprises an encoder replica and processes an output signal of the encoder replica on a bit by bit basis, that is, which is operable as an error-correcting bit-serial decoder.

Other objects of the invention will become clear as the description proceeds.

It is possible on describing the gist of this invention to define that an error-correcting decoder to which this invention is applicable, is for use as a counterpart of an error-correction encoder for encoding an information symbol sequence into a code symbol sequence comprising the information symbol sequence and a redundancy bit sequence in accordance with a predetermined rule and comprises (1) an encoder replica responsive to an input code sequence corresponding to the code symbol sequence for producing a replica output signal with reference to the predetermined rule and (2) a sequential decode controller for executing a sequential decoding algorithm on the input code sequence and the replica output signal to supply the encoder replica with a control signal for use in making the encoder replica decode the input code sequence into a decoded symbol sequence which gives a reproduction of the information symbol sequence.

According to this invention, the above-defined decoder is characterised in that the encoder replica comprises (A) a one-bit memory, (B) input means for delivering consecutive bits of the input code sequence to the one-bit memory to make the one-bit memory successively memorize the consecutive bits, and (C) output means for producing replica output bits in response to the consecutive bits successively memorized in the one-bit memory and for delivering the replica output bits in bit series to the sequential decode controller as the replica output signal produced with reference to the predetermined rule so that the encoder replica may be responsive to the control signal to produce the decoded symbol sequence in response to the consecutive bits successively memorized in the one-bit memory.

Preferably, the decoder further comprises (i) bit position counting means responsive to the control signal for counting positions of the respective consecutive bits in the input code sequence to produce a bit position count signal representative of the positions and (ii) a discriminator responsive to the bit position count signal for producing a first and a second discrimination signal wherein the first discrimination signal indicates positions of span bits collectively corresponding in the input code sequence to the information symbol sequence and wherein the second discrimination signal indicates positions of intermittent bits collectively corresponding in the input code sequence to the redundancy bit sequence. In this event, the output means comprises a replica output selector responsive to the first discrimination signal for selecting, as tentatively predicted bits, the consecutive bits successively memorized in the one-bit memory and responsive to the second discrimination signal for selecting, as parity bits, the output bits of a function generator to deliver the tentatively predicted bits and the dummy bits in bit series to the sequential decode controller as the replica output bits.

According to an aspect of this invention, the bit position counting means comprises a position counter responsive to the control signal for counting the positions of the respective consecutive bits in the input code sequence to produce the bit position count signal.

According to another aspect of this invention, the bit position counting means comprises (a) a position counter responsive to the control signal for counting the positions of the respective consecutive bits in the input code sequence to produce a subsidiary position count signal representative of the positions of the respective consecutive bits, (b) synchronism shift counting means responsive to the control signal for counting an amount of shift in synchronism of the input code sequence to produce a synchronism shift count signal representative of the amount of shift, and (c) a correction circuit responsive to the subsidiary position count signal and the synchronism shift count signal for correcting the subsidiary position count into the bit position count in response to the amount of shift to produce the bit position count signal.

DESCRIPTION OF THE PREFERRED EMBODIMENTS

Figure 1:
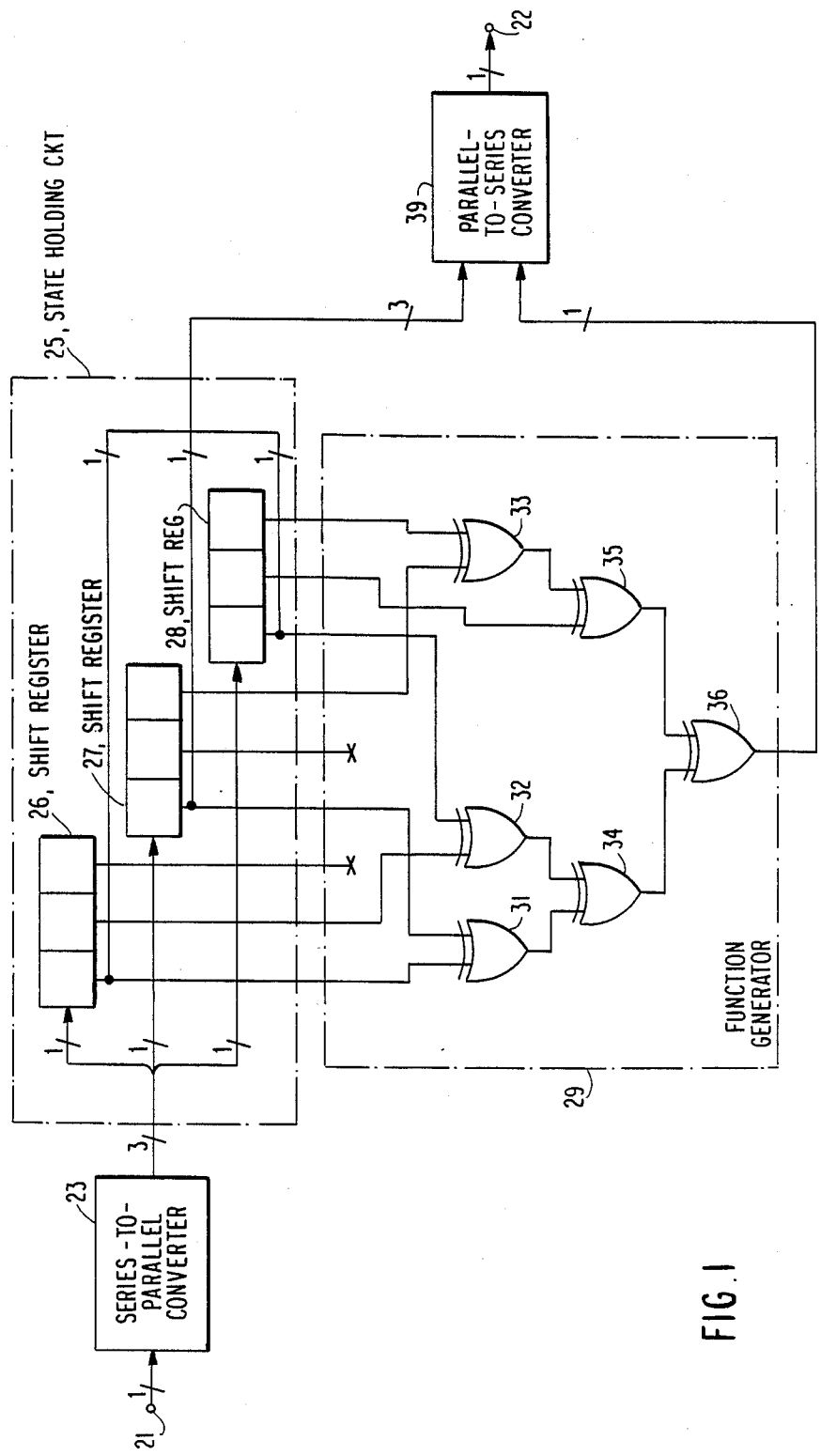
FIG. 1 shows a block diagram of a specific example of error-correction encoders for use in facilitating an understanding of the instant invention.

Referring to FIG. 1, a specific example of error-correction encoders will be described at first in order to facilitate an understanding of the present invention. Such an error-correction encoder will briefly be called an encoder insofar as no inconvenience arises.

In FIG. 1, the encoder has encoder input and output terminals 21 and 22. The encoder output terminal 22 is for connection to either a transmission channel or route or to a storage medium (not shown). It will be assumed for a short while that the output terminal 22 is connected to a transmission channel.

The encoder input terminal 21 is supplied with a sequence of information bits representative of data or information which should be transmitted to the transmission channel together with a sequence of redundancy bits. For this purpose, the information bit sequence is delivered from the input terminal 21 to a serial-to-parallel converter 23 which is for segmenting the information bit sequence into a sequence of information symbols having a common bit or symbol length of three bits and is for producing the bits of each information symbol in bit parallel at a time.

The encoder comprises an encoder state holding circuit 25 which, in turn, comprises first through third parallel shift registers 26, 27, and 28 depicted in a staggered fashion merely for convenience of illustration. In the example being illustrated, each shift register has first through third stages from a left end to a right end of that shift register. The first stages of the respective shift registers 26 through 28 are connected to the series-to-parallel converter 23 to receive parallel bits of each information symbol from the series-to-parallel converter 23. Inasmuch as each shift register has three stages, such parallel bits of three information symbols are held in the state holding circuit 25 at a time and are shifted through the respective shift registers 26 and 28 rightwardly of the figure in the manner known in the art. In this manner, the state holding circuit 25 has an encoder internal state which is renewed when supplied with each information symbol from the series-to-parallel converter 23 as a fresh information symbol. At this instant of time, the state holding circuit 25 produces, as an output information symbol in bit parallel, one of the three information symbols that is held in the left ends of the respective shift registers 26 to 28.

The encoder further comprises an encoder function generator 29 coupled to the encoder state holding circuit 25 in a predetermined manner which will presently be exemplified. Responsive to the encoder internal state of the state holding circuit 25, the function generator 29 produces one or a plurality of redundancy bits concurrently with production in bit parallel of each output information symbol from the state holding circuit 25.

In FIG. 1, the encoder function generator 29 comprises first through sixth Exclusive OR circuits 31, 32, 33, 34, 35, and 36. Supplied with the bits which are kept in the respective first stages of the first and the second shift registers 26 and 27, the circuit 31 produces a first output bit. Supplied with the bits from the second stage of the first shift register 26 and from the first stage of the third shift register 28, the circuit 32 produces a second output bit. Supplied with the bits from the respective third stages of the second and the third shift registers 27 and 28, the circuit 33 produces a third output bit. Responsive to the first and the second output bits, the circuit 34 produces a fourth output bit. Supplied with the third output bit and with the bit from the second stage of the third shift register 28, the circuit 35 produces a fifth output bit. The third stage of the first shift register 26 and the second stage of the second shift register 27 are connected to none of the circuits 31 through 36. Responsive to the fourth and the fifth output bits, the circuit 36 produces an odd parity bit as each redundancy bit of the redundancy bit sequence.

From the encoder state holding circuit 25 and the encoder function generator 29, the output information symbol and the redundancy bit are delivered to a parallel-to-series converter 39 as four parallel bits of a code symbol. For transmission to the transmission channel, the parallel-to-series converter 39 delivers the bits of a sequence of such code symbols to the encoder output terminal 22 in bit series. In this manner, the code symbol sequence comprises the information symbol sequence and the redundancy bit sequence in accordance with a predetermined rule.

For a different rule, the encoder function generator 29 may be coupled in a different manner to the encoder state holding circuit 25. Each shift register may have a different number of stages. The parallel-to-series converter 39 may differently convert the parallel bits of each output information symbol and each redundancy bit into series bits of the code symbol.

Figure 2:
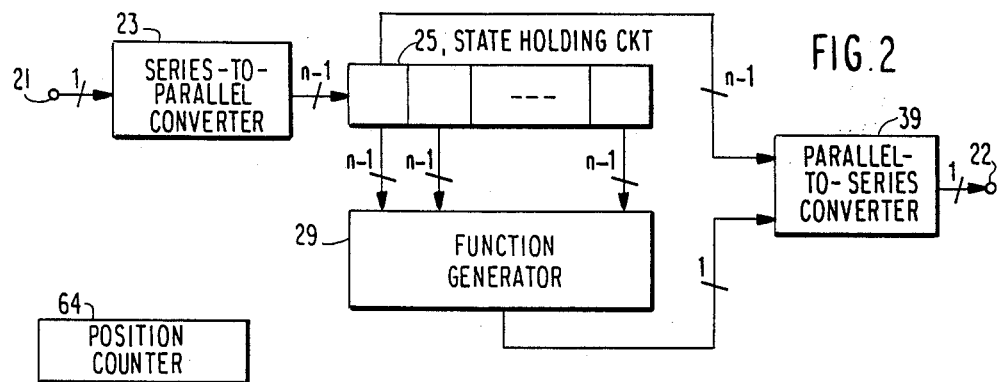
FIG. 2 shows a block diagram of a more general example of the error-correction encoders for a similar use.

Turning to FIG. 2, a more general example of the encoders comprises similar parts which are designated by like reference numerals and are operable with likely named signals. In the example being illustrated, the encoder is for code symbols of a common bit length of n bits in which a single redundancy bit is added to each information symbol having a bit length of (n − 1) bits.

The series-to-parallel converter 23 produces parallel bits, (n − 1) in number, of each information symbol at a time. The encoder state holding circuit 25 comprises (n−1) parallel shift registers like the state holding circuit 25 described in conjunction with FIG. 1. When each information symbol is delivered from the series-to-parallel converter 23 to the left ends of the respective shift registers in bit parallel as a fresh information symbol, the output information symbol is produced also in bit parallel from the left ends of the respective shift registers and is delivered to the parallel-to-series converter 39. The state holding circuit 25 has an encoder internal state which is renewed when supplied with each fresh information symbol to produce the output information symbol. The right ends of the (n−1) shift registers are depicted at the top thereof.

The encoder function generator 29 is coupled to the encoder state holding circuit 25 in a predetermined manner to receive (n−1) bits of each information symbol from the respective shift registers. Depending on the predetermined manner of coupling, the function generator 29 delivers one or a plurality of redundancy bits to the parallel-to-series converter 39 simultaneously with delivery of (n−1) parallel bits of each output information symbol from the respective shift registers to the parallel-to-series converter 39. In FIG. 2, only one redundancy bit is produced at each time instant. In any event, a code symbol sequence is transmitted in bit series to the transmission channel through the encoder output terminal 22.

Reviewing FIGS. 1 and 2, it will be understood that the encoder function generator 29 is for producing a redundancy bit sequence in response to the encoder internal state which the encoder state holding circuit 25 has and which is successively renewed by an information symbol sequence. The encoder is therefore for use in encoding an information symbol sequence into a code symbol sequence which comprises the information symbol sequence and a redundancy bit sequence in accordance with a predetermined rule. Incidentally, a multilevel modulator may be substituted for the parallel-to-series converter 39 when the encoder output terminal 22 is connected to a transmission channel.

In the manner written by George C. Clark, Jr., and J. Bibb Cain in a book titled "Error-Correction Coding for Digital Communications" which was first published 1981 by Plenum Press, N.Y. and London, particularly on pages 227 through 231 of the book, various codes are used in error-correction encoding. By way of example, the code symbol may be a tree code, such as a convolutional code or a trellis code. From a different point of view, the code symbol may be a systematic code which is formed by addition of a predetermined number of redundancy bits to each information symbol. The predetermined number may be equal to unity as exemplified above in connection with the specific and the more general examples of the encoders. Alternatively, the code symbol may be a nonsystematic code which is other than the systematic does like a quick look-in code. It should be noted here that the systematic code is commercially important among the tree codes of various types.

Figure 3:
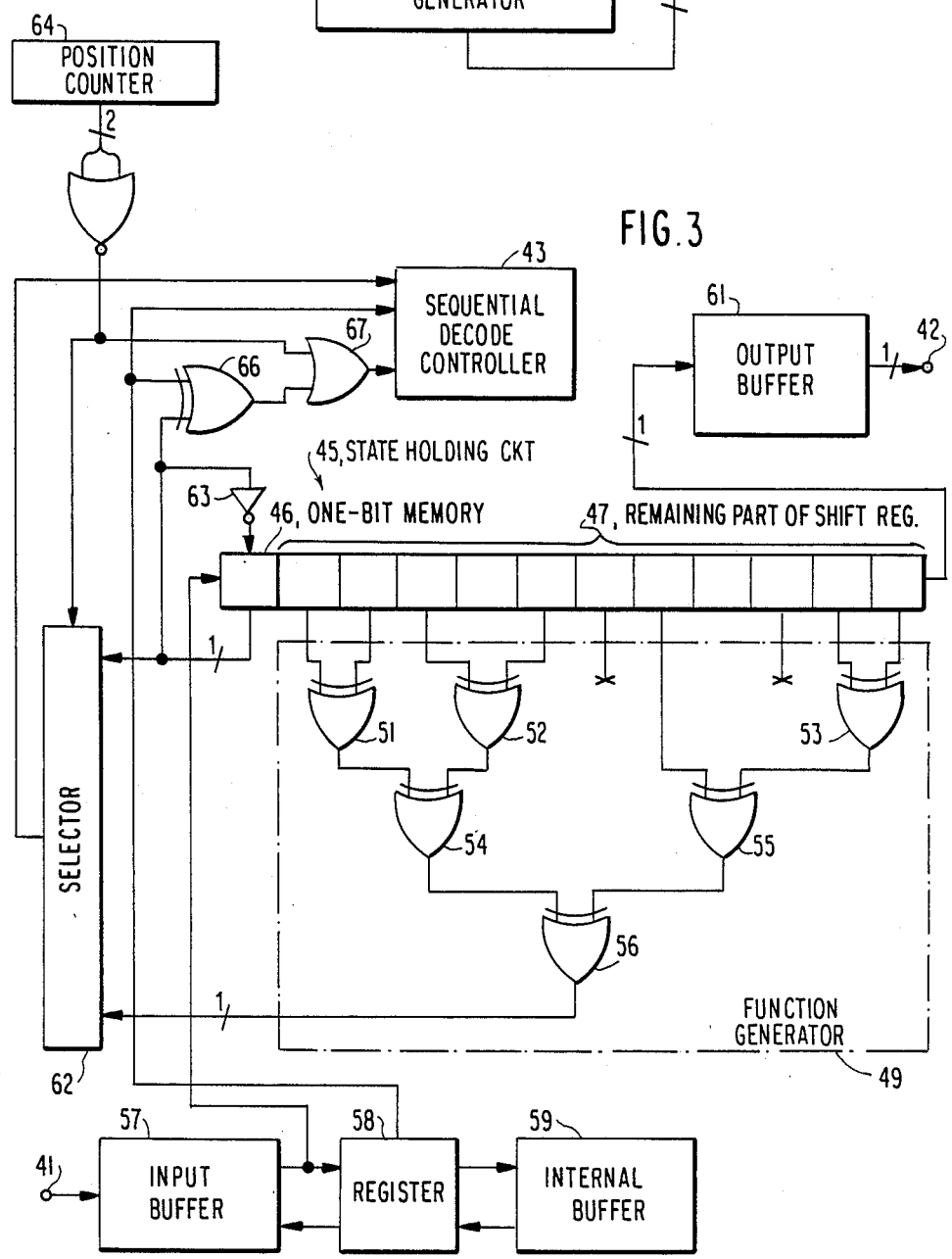
FIG. 3 is a block diagram of an error-correcting decoder according to a first specific embodiment of this invention.

Referring now to FIG. 3, the description will proceed to an error-correcting decoder according to a first specific embodiment of this invention. Like the error-correction encoders, such an error-correcting decoder will simply be called a decoder. It will be assumed that the decoder being illustrated is for use as a counterpart of the encoder illustrated with reference to FIG. 1. That is, the decoder is for use in combination with an encoder which encodes three-bit information symbols into a four-bit code symbol sequence with a single redundancy bit added to each information symbol in accordance with a predetermined rule exemplified in conjunction with FIG. 1.

The decoder has decoder input and output terminals 41 and 42. In the manner which will become clear as the description proceeds, the decoder comprises an encoder replica and a sequential decode controller 43. In FIG. 3, the encoder replica comprises a decoder state holding circuit 45 which is implemented by a single shift register consisting of a one-bit memory 46 at a left end as a first stage of the shift register and second and other consecutively number stages as a remaining part 47. The encoder replica further comprises a decoder function generator 49 which, in turn, comprises first through sixth Exclusive OR circuits 51, 52, 53, 54, 55, and 56.

Either transmitted through a transmission channel or once stored in a storage medium and then reproduced therefrom, the code symbol sequence is delivered to the decoder input terminal 41 as an input code sequence of consecutive bits. When compared with the code symbol sequence produced in the encoder, the input code sequence may have an error or errors mainly due to noise in the transmission channel or physical defects of the storage medium. Without regard to presense or absence of such an error, it is possible to understand that the input code sequence corresponds to the code symbol sequence.

The consecutive bits of the input code sequence are delivered in effect to the one-bit memory 46 and are successively memorized therein. For the decoder being illustrated, the input code sequence is a sequence of received codes which are in correspondence to the respective code symbols and have a common bit or code length of four bits. Inasmuch as the predetermined rule is applied in the encoder of FIG. 1 to each set of three information symbols, the single shift register of the decoder state holding circuit should have stages for each set of three four-bit received codes, namely, from the first stage or the one-bit memory 46 up to a twelfth stage at a right end of the remaining part 47.

It is to be noted in connection with the following description that the consecutive bits comprise span bits or bits of spans collectively corresponding in the input code sequence to the information symbol sequence and intermittent bits collectively corresponding in the input code sequence to the redundancy bit sequence. Each span consists of three bits in the example being illustrated. Among the first through the twelfth stages of the decoder state holding circuit 45, nine stages are for three three-bit spans. Three stages are for three intermittent bits. At any rate, the state holding circuit 45 has a decoder internal state which is renewed as soon as each received code is stored therein as a fresh input code. At this instant, one of the three received codes held in the state holding circuit 45 overflows and is produced from the right end as an output code.

The decoder function generator 49 is coupled to the decoder state holding circuit 45 to be responsive to the decoder internal state in a manner which corresponds to the predetermined manner used in the encoder. More particularly, only nine bits of the three spans are delivered to the function generator 49 in timed relation to renewal of the internal state. Like in the encoder function generator 25 described in connection with FIG. 1, two of the nine bits are not used in the example being illustrated. The three intermittent bits are not delivered to the function generator 49. Responsive to the internal state, the function generator 49 produces a bit corresponding to each redundancy bit when each output code is produced from the state holding circuit 45.

During a short while, attention will be directed to a conventional decoder with FIG. 3 referred to merely for convenience of the description. The conventional decoder comprises a sequential decode controller and an encoder replica which are similar to the sequential decode controller 43 and the encoder replica comprising the decoder state holding circuit 45 and the decoder function generator 49. In response to the input code sequence, as in response to the consecutive bits successively delivered to the one-bit memory 46 in FIG. 3, such an encoder replica produces a replica output signal with reference to the predetermined rule which is used in the code symbol sequence produced in the encoder. The sequential decode controller is for executing a sequential decoding algorithm on the input code sequence and the replica output signal to supply the encoder replica with a control signal. Controlled by the control signal, the encoder replica automatically corrects the error or errors, if any, in the input code sequence and decodes the input code sequence into a decoded symbol sequence which gives a reproduction of the information symbol sequence used in the encoder. It is to be noted as will become clear as the description proceeds that the encoder replica of the conventional decoder is appreciably different from the encoder replica including the one-bit memory 46. Above all, the prior art encoder replica produces the replica output signal on a symbol by symbol or code by code basis. The prior art sequential decode controller executes the sequential decoding algorithm on such a symbol by symbol basis.

In the above-cited book of George C. Clark, Jr., and J. Bibb Cain, particularly on pages 267 through 328 of the book, various sequential decoding algorithms are described. For example, the sequential decode controller may use an algorithm which is known as the Fano algorithm in the art and will be exemplified in the following. The Fano algorithm is described in detail in an article contributed by Robert M. Fano to IEEE Transactions on Information Theory, Volume IT-9, Apr. 1963, pages 64 through 74, under the title of "A Heuristic Discussion of Probabilistic Decoding." As an alternative, the sequential decode controller may use another algorithm which is the Fano algorithm improved by Robert G. Gallager and is described in a book written by him under the title of "Information Theory and Reliable Communication" and published 1968 by John Wiley and Sons, Inc. This latter algorithm will herein be referred to briefly as the Gallager algorithm and will be exemplified shortly hereunder.

The Fano algorithm will now be described in connection with a case wherein the information symbols having a common bit length of two bits in the information symbol sequence used in the encoder. More specifically, each information symbol is one of four possible or allowable symbols 00, 01, 10, and 11. When individually supplied with the four possible symbols, the encoder replica produces replica output symbols in correspondence to the four possible symbols. The sequential decode controller compares each received code cyclically or otherwise with the replica output symbols and predicts or decides that the received code under consideration is one of the replica output symbols that has a maximum likelihood relative to the received code in question. In this manner, the control signal is used in making the encoder replica produce decoded symbols of the decoded symbol sequence as the replica output symbols delivered to the sequential decode controller in the replica output signal.

The Fano likelihood $\lambda$, as called in the art, is widely used on comparing the likelihoods which the respective replica output symbols have relative to each received code. The Fano likelihood is defined by:

$$\lambda = \log_2[p(y|x)/p(y)] - B,$$

where $p(y)$ represents a probability that the received code is a code y, $p(y|x)$ represents another probability that the decoder receives the received code y when the encoder produces a code symbol x, and B represents a parameter which is called a bias term and for which an optimum value is preliminarily decided as by simulation. The Fano likelihood has a real value. In practice, the Fano likelihood is approximated for convenience of implementation of the sequential decode controller by an integer which is approximately proportional to the real value. Moreover, the decoded symbols are successively decided for the decode symbol sequence so as to have a maximum accumulated likelihood relative to the input code sequence.

It is to be noted here that a great number of errors may appear in the input code sequence when the transmission channel is subjected to strong noise or when the storage medium has many physical defects. In such an event, an erroneous symbol may be decided as a decoded symbol. Once such an erroneous decision is carried out, the decoder internal state will thereafter become different from the encoder internal state. As a result, the sequential decode controller becomes incapable of finding a replica output symbol of a great Fano likelihood. It is therefore possible, from a difficulty in finding a replica output symbol of a great Fano likelihood, to detect the fact that an erroneous decision was done in the past. A rigorous criterion is described in the Fano article for use in judging whether or not an erroneous symbol has ever been decided as a decoded symbol.

According to the Fano algorithm, the decoder internal state is returned back to a past internal state when the sequential decode controller finds it difficult to decide a replica output symbol of a great Fano likelihood. Thereafter, the sequential decode controller again executes the Fano algorithm to decide, as a corrected symbol, a replica output symbol having the Fano likelihood which is next great to the Fano likelihood calculated for the erroneous symbol. The Fano algorithm is restarted from the corrected symbol. If such a return to the past internal state has ever done, the last-mentioned replica output symbol must have already been tested as regards the Fano likelihood. In this event, the decoder internal state is returned further back to a more previous state. The Fano likelihood is once again calculated to decide another replica output symbol as another corrected symbol. In this manner, the Fano algorithm proceeds according to a trial and error technique.

In the above-described case wherein the Fano algorithm is applied to a decoder for which the two-bit information symbols are used in the encoder, the Fano likelihood is calculated four times for each received code. The four Fano likelihoods are compared with one another. Comparison is therefore carried out three (namely, four less one) times.

Another case will be taken into consideration wherein the encoder deals with information symbols a having a common bit length of eight bits. In this latter case, the Fano likelihood must be calculated 256 times for each received code. Comparison of such likelihoods must be done 255 times. Comparison of the Fano likelihood becomes very troublesome.

The Gallager algorithm will next be described as regards the two-bit information symbols. Instead of comparing the likelihoods of the respective replica output symbols with one another, the four possible symbols 00, 01, 10, and 11 are forcibly selected one at a time as the received code according to a predetermined priority. For instance, the possible symbol 00 is selected at first as the received code. Stated otherwise, the received code is assumed at first to be the possible code 00 according to the priority. Only when it is found that this assumption is unsuccessful, the received code is assumed in a next step to be another possible symbol, such as the possible symbol 01. Until this step, two of the four possible symbols are successively selected according to the priority.

It is to be noted in connection with the Gallager algorithm that the received code may not necessarily be one of the possible symbols that has a highest priority. If the possible symbol of the highest priority is not the received code, correction of the assumption becomes mandatory.

Either the systematic code or the quick look-in code is therefore used in the encoder as the code symbols when the sequential decode controller is in operation in the counterpart decoder according to the Gallager algorithm. With the systematic code, it is possible to reduce the trouble of later correcting the assumption. More particularly, use of the systematic code makes it possible to predict a decoded symbol directly from each received code to a certain degree of correctness. With the quick look-in code, it is possible to predict the decoded symbol by an Exclusive OR of each bit of the received code and the most significant bit of a previously received code. The possible symbols are therefore selected in practice, not according to the predetermined priority, but successively from one of the possible symbols that is most similar to the decoded symbol predicted for each received code.

Attention will now be directed to the information symbols having a common bit length of three bits. In this case, there are eight possible symbols or possible symbols of eight sorts 000, 001, . . . , and 111. When the sequential decode controller is in operation in compliance with the Fano algorithm, the likelihood must be calculated eight times for each received code. Comparison must be done seven (that is, eight less one) times for each received code. When the sequential decode controller is in operation with the Gallager algorithm, erroneous symbols are successively selected as each received code about four (namely, eight divided by two) times on the average before a correct one of the eight possible symbols is selected as the received code even when the input code sequence has no error. Summarizing, the conventional decoder has a slow decoding speed.

By the way, principles of this invention will be described. It will be assumed that the encoder produces a sequence of systematic codes of the type described heretobefore. When the systematic codes are used, the information symbols have a common bit length. It should be noted here that a conventional sequential decoding algorithm, such as the Fano algorithm, is applicable to a code symbol sequence for which the information symbols have different bit lengths and in which the redundancy bits of different numbers are added to the respective information symbols depending on positions of the respective information symbols in the code symbol sequence. In this event, the decoder has an error correcting capability which depends on the positions of the information symbols. This is not desirable in data transmission for which the error correcting capability should be constant throughout the input code sequence. As a consequence, it has been the practice not to use a code symbol sequence for which the information symbols have different bit lengths.

In the manner described before in conjunction with FIGS. 1 and 2, the information symbols have a common bit length in the encoder. The input code sequence is, however, decoded with a presumption such that the code symbol sequence is a bit sequence which is equivalent to the code symbol sequence and in which the information symbols have different bit lengths. Preferably, the different bit lengths should be shorter than the common bit length. This presumption makes it quite unexpectedly possible to decode the input code sequence at a high decoding speed as will be described in the following.

A case will be taken into consideration wherein the encoder is for encoding a sequence of information symbols having a common bit length of k bits into a sequence of systematic code symbols of a common bit length of n bits, where n is greater than k. Whenever supplied with each bit of the k bits of the information symbol, the encoder decides bit by bit k bits among the n bits of the code symbol with (n−k) bits of the code symbol left as remaining bits. When supplied with all of the k bits of the information symbol, the encoder decides the (n−k) remaining bits of the code symbol. It is therefore possible to understand that the encoder produces, in a k-bit preceding half of each n-bit code symbol in the bit sequence, a one-bit code symbol for each one-bit information symbol and, in an (n−k)-bit succeeding half of the n-bit code symbol, another one-bit code symbol for each zero-bit information symbol.

For example, let the Fano algorithm be used in the sequential decode controller 43 depicted in FIG. 3. According to prior art, the likelihoods are calculated for the possible symbols of $2^k$ sorts. The comparison of the likelihood is done $(2^k-1)$ times. According to this invention, the likelihoods are calculated for the possible symbols of only one or two sorts, namely, for only one or two possible symbols. It is sufficient to carry out the comparison only k times for each symbol. This shows that the presumption results in a high decoding speed when the number k is great.

A numerical example will be described. Let the number k be two and the number n be three. Whenever supplied with each bit of the two-bit information symbol, the encoder produces two bits of the three-bit code symbol in bit series. When supplied with all of the two bits of the information symbol, the encoder decides one remaining bit of the three-bit code symbol. The encoder therefore produces, in a two-bit preceding half of each three-bit code symbol, a one-bit code symbol for each one-bit information symbol and, in a one-bit succeeding half of the three-bit code symbol, another one-bit code symbol for a zero-bit information symbol. According to prior art, the likelihoods are calculated as regards four possible symbols. Comparison of the likelihood is carried out three (that is, four less one) times. According to this invention, the likelihoods are calculated as regards two possible symbols. It is sufficient that the comparison be carried out only twice for each symbol. It will be understood even for the three-bit information symbols that an appreciably high decoding speed is achieved by using the presumption set forth above.

It is to be noted in connection with the principles of this invention that the input code sequence is decoded by presuming that the information symbols have a one-bit and a zero-bit length depending on positions which such information symbols have in the input code sequence. It is therefore possible to use a decoder for use in decoding an input code sequence, wherein the information symbols have a common bit length of one bit, with introduction of a little modification which will become clear in the following. Incidentally, it is possible to decode an input code sequence for one-bit information symbols and two-bit code symbols by a decoder disclosed by George David Forney, Jr., in U.S. Pat. No. 3,665,396.

Reverting to FIG. 3, it may be mentioned here that the decoder input terminal 41 is supplied in general, as an analog received signal, the code symbol sequence produced in the encoder. The decoder therefore comprises an analog-to-digital converter (not shown) for converting the analog received signal to a binary digital signal which is used as the input code sequence of the consecutive bits. In the manner described above in connection with the principles of this invention, it is preferred that the input code sequence should be used as a bit sequence of shorter codes of a common bit length of a few bits. Such shorter codes of a two-bit length will be used in the following description.

The sequential decode controller 43 has a structure which is identical in principle with that of the sequential decode controller described above in conjunction with the conventional decoder. To be a little more in detail, the sequential decode controller 43 is for executing a sequential decoding algorithm, such as the Fano or the Gallager algorithm, on the input code sequence and the replica output signal to deliver a control signal to a bus which will later be illustrated. It should, however, be noted that the sequential decode controller 43 processes the input code sequence and the replica output signal on a bit by bit basis or in bit series and therefore deals with a smaller number of bits at each instant of time in marked contrast to the sequential decode controller of prior art.

In the manner which will become clear as the description proceeds, a forward move signal is produced as the control signal during forward progress of the sequential decoding algorithm. A lateral move signal is produced as the control signal when an erroneous bit, corresponding to an erroneous symbol, is memorized in the one-bit memory 46 and should be corrected to a corrected bit which corresponds to the corrected symbol described before. A backward move signal is produced as the control signal when the decoder internal state should be returned from a current internal state back to a past internal state or from the past internal state further back to a more previous state.

Among others, the forward move signal is used as a shift pulse sequence for the single shift register of the decoder state holding circuit 45 in shifting the bit held in the one-bit memory 46 to and through the remaining part 47 of the single shift register forwardly, that is, rightwardly of the figure. The backward move signal is used in backwardly or leftwardly shifting the bits in the state holding circuit 45. The single shift register should therefore be a bidirectional shift register.

An input circuit is used in receiving the consecutive bits of the input code sequence from the decoder input terminal 41 and for delivering the consecutive bits to the one-bit memory 46. In this manner, the consecutive bits are successively memorized in the one-bit memory 46. The input circuit is used also in delivering the input code sequence to the sequential decode controller 43.

More particularly, the forward move signal is used in forwardly delivering the consecutive bits from the decoder input terminal 41 to an input buffer 57 for storage therein as input bits. Through a rightwardly leading line, the input bits are forwardly delivered from the input buffer 57 to a register 58 which is for memorizing each shorter code of the input code sequence as a stored code. Such stored codes are successively forwardly delivered from the register 58 to an internal buffer 59 for storage therein as internal codes. When stationary forward delivery is achieved, the input bits are delivered to the register 58 after the stored code is delivered to the internal buffer 59. In the meantime, the input bits are delivered from the rightwardly leading line to the one-bit memory 46. Each stored code is delivered from the register 58 to the sequential decode controller 43. In this manner, the consecutive bits are delivered to the one-bit memory 46. The input code sequence is delivered to the sequential decode controller 43.

During the backward delivery, the backward move signal is used in backwardly delivering each stored code from the register 58 to the input buffer 57 and each internal code from the internal buffer 59 to the register 58. Incidentally, the one-bit memory 46 is supplied with the most significant bit of a leading code among the received codes at first after the decoder input terminal 41 begins to receive the input code sequence.

While the forward move signal is produced to carry out forward shift of bits through the decoder state holding circuit 45, the state holding circuit 45 successively supplies an output buffer 61 with circuit output bits from the twelfth stage of the remaining part 47 of the single shift register. The output buffer 61 is for temporarily memorizing the circuit output bits as stored bits. In the manner which will later become clear, the stored bits comprise an intermittent sequence of decoded symbols and intermittent parity bits which are substituted for the respective intermittent bits. It is now understood that the forward move signal is used in making the encoder replica produce the decoded symbol sequence in response to the consecitive bits which are successively memorized in the one-bit memory 46. Incidentally, a single buffer for 8,192 bits may be used in common as the input buffer 57, the internal buffer 59, and the output buffer 61.

When the backward move signal is produced to carry out backward shift of bits in the decoder state holding circuit 45, the stored bits are successively delivered from the output buffer 61 back to the twelfth stage of the remaining part 47 of the single shift register. Upon backward overflow from the one-bit memory 46, the bits may be discarded.

An output circuit is used in producing replica output bits in response to the consecutive bits successively memorized in the one-bit memory 46 and in delivering the replica output bits on the bit by bit basis to the sequential decode controller 43 as the replica output signal produced with reference to the predetermined rule. In the output circuit, a replica output selector 62 is controlled by a first and a second discrimination signal which will presently be described.

On successively memorizing the consecutive bits, the one-bit memory 46 memorizes the above-described span bits as tentatively predicted bits which are tentatively predicted as the respective span bits. The intermittent bits are memorized as dummy bits. The replica output bits therefore comprise the tentatively predicted bits and the dummy bits which are memorized in the one-bit memory 46 one at a time. The decoded symbol sequence is produced in response to the tentatively predicted bits with the dummy bits suppressed on delivery to the decoder output terminal 42 in the known manner.

In the manner described before, the register 58 successively supplies the sequential decode controller 43 with the consecutive bits of the input code sequence. Responsive to the first discrimination signal, the replica output selector 62 selects, as the replica output bits, the tentatively predicted bits from the consecutive bits which are successively memorized in the one-bit memory 46. In accordance with the sequential decoding algorithm, the sequential decode controller 43 decides whether or not the tentatively predicted bits are information predicting bits which are predictive of bits corresponding in the input code sequence collectively to the information symbol sequence. The forward move signal is produced when the tentatively predicted bits are the information predicting bits. The lateral move signal is produced when the tentatively predicted bits are not the information predicting bits. The backward move signal is produced when it is difficult to decide whether or not the tentatively predicted bits are the information predicting bits to indicate the fact that an erroneous decision may have been done in the past.

When the forward move signal is produced, the tentatively predicted bits are regarded as the information predicting bits in the one-bit memory 46. Meanwhile, the one-bit memory 46 supplies an inverter 63 with the tentatively predicted bits memorized therein one at a time. The inverter 63 successively inverts the tentatively predicted bits into inverted bits. When the lateral move signal is produced, the inverted bits are substituted in the one-bit memory 46 as the information predicting bits for the tentatively predicted bits. Responsive to the forward move signal, such information predicting bits are delivered from the one-bit memory 46 to the remaining part 47 together with the dummy bits and to the output buffer 61 as the decoded symbols. The encoder replica is therefore controlled by the forward move signal to produce, collectively as the decoded symbol sequence, the information predicting bits memorized in the one-bit memory 46 one at a time.

The decoder comprises a bit position counting circuit responsive to the forward, the lateral, and the backward move signals for counting positions of the consecutive bits in the input code sequence. In FIG. 3, the bit position counting circuit is controlled only by the forward and the backward move signals and is implemented by a position counter 64 which has a bit position count and is a modulo-4 quarternary counter, that is, a two-bit binary counter. When the code symbols are produced in the encoder to have a common bit length of a predetermined number of bits in general, the bit position count should be congruent with a predetermined position count modulo the predetermined number. Without loss of generality, it is possible to understand that the predetermined position count is equal to decimal zero, namely, is represented by two binary zero bits in the example under consideration.

Responsive to the forward and the backward move signals, the position counter 64 counts up and down the bit position count one by one and produces a bit position count signal representative of the bit position count. When the bit position count is equal to the predetermined position count, the bit position count signal indicates the positions of the intermittent bits in the input code sequence. Otherwise, the bit position count signal indicates the positions of the span bits in the input code sequence.

Responsive to the bit position count signal, a discriminator 65 produces the first and the second discrimination signals. When the bit position count signal represents the predetermined position count, the second discrimination signal is produced. Otherwise, the first discrimination signal is produced. In FIG. 3, the discriminator 65 is implemented by a combination of an OR circuit for producing an OR output and an inverter for inverting the OR output. The first discrimination signal is therefore a one-bit binary one signal. The second discrimination signal is a one-bit binary zero signal.

Whenever the second discrimination signal is produced during the stationary forward delivery through the input buffer 57, the register 58, and the internal buffer 59, the decoder function generator 49 produces one of the parity bits in compliance with the information predicting bits held in the decoder state holding circuit 45 at that instant of time during forward shift of bits in the state holding circuit 45. Responsive to the second discrimination signal, the replica output selector 62 selects such parity bits as the dummy bits for delivery to the sequential decode controller 43. It is now understood that the output circuit produces the replica output signal with reference to the predetermined rule used in the encoder.

Summarizing, each tentatively predicted bit should be delivered to the replica output signal and should be an information predicting bit when the information symbol has a one-bit length in the input code sequence. Each parity bit should be produced when the information symbol has a zero-bit length in the input code sequence. It will now be appreciated that the replica output selector 62 is controlled by the bit position counting circuit to produce the replica output signal in synchronism with the input code sequence and with reference to the predetermined rule used in the encoder.

When the sequential decode controller 43 finds that a certain bit was erroneously decided as the information predicting bit in the past and was an erroneous bit, similar to the erroneous symbol described before, the sequential decode controller 43 produces the backward move signal to return the decoder internal state from a current internal state back to a past internal state. The lateral move signal is produced to correct the erroneous bit into a corrected bit. Correction is carried out by substituting an inverted bit of the inverter 63 in the one-bit memory 46 for the erroneous bit.

The correction is, however, not always possible. That is, the correction may be impossible or meaningless. The correction is impossible if the erroneous bit was already subjected to correction in the past internal state by substituting an inverted bit in the one-bit memory 46 for a different bit which was decided not to be an information predicting bit. Should correction be again done, the different bit would once more be used as the corrected bit. Endlessly repeated substitution of the inverted bit for the different bit and of the different bit for the inverted bit does not result in correction. The correction is meaningless if the second discrimination signal is produced on correcting the erroneous bit. In this event, the erroneous bit is a dummy bit, namely, one of the intermittent bits.

The decoder therefore comprises a lateral impossible detecting circuit responsive to the input code sequence and the bit memorized in the one-bit memory 46 as the bit in question for producing a lateral impossible signal which indicates that the discriminator 65 produces the second discrimination signal and/or that the bit under consideration was already subjected to correction in the past. In response to the lateral impossible signal, the sequential decode controller 43 again produces the backward move signal to return the past internal state further back to a more previous state.

In FIG. 3, the lateral impossible detecting circuit comprises an Exclusive OR circuit 66 supplied with the bit held in the one-bit memory 46 and a result of hard decision of each bit of one of the received codes that is currently memorized in the register 58 as the stored code. It is possible to understand in the figure that the hard decision is carried out immediately before the bit is supplied from the register 58 to the Exclusive OR circuit 66. Thus supplied with two bits at a time, the Exclusive OR circuit 66 produces a correction detection signal which indicates whether or not correction was ever done on the bit held in the one-bit memory 46. If the one-bit memory 46 holds an inverted bit, correction was already done. In this case, the inverted bit is different from the result of hard decision. The correction is impossible. If the one-bit memory 46 holds a bit which is not yet subjected to correction, the result of hard decision is identical with the bit held in the one-bit memory 46. In this latter event, correction is possible.

In the lateral impossible detecting circuit, an OR circuit 67 is used to receive the correction detection signal and the first or the second discrimination signal. The lateral impossible signal is delivered from the OR circuit 67 to the sequential decode controller 43 when correction detection signal is produced and/or when the discriminator 65 produces the second discrimination signal. Supplied with the lateral impossible signal, the sequential decode controller 43 again produces the backward move signal in the manner described above. When the lateral impossible signal is not produced, the correction is carried out on the bit under consideration. Subsequently, the sequential decode controller 43 produces the forward move signal to restart the sequential decoding algorithm from the past internal state.

Figure 4:
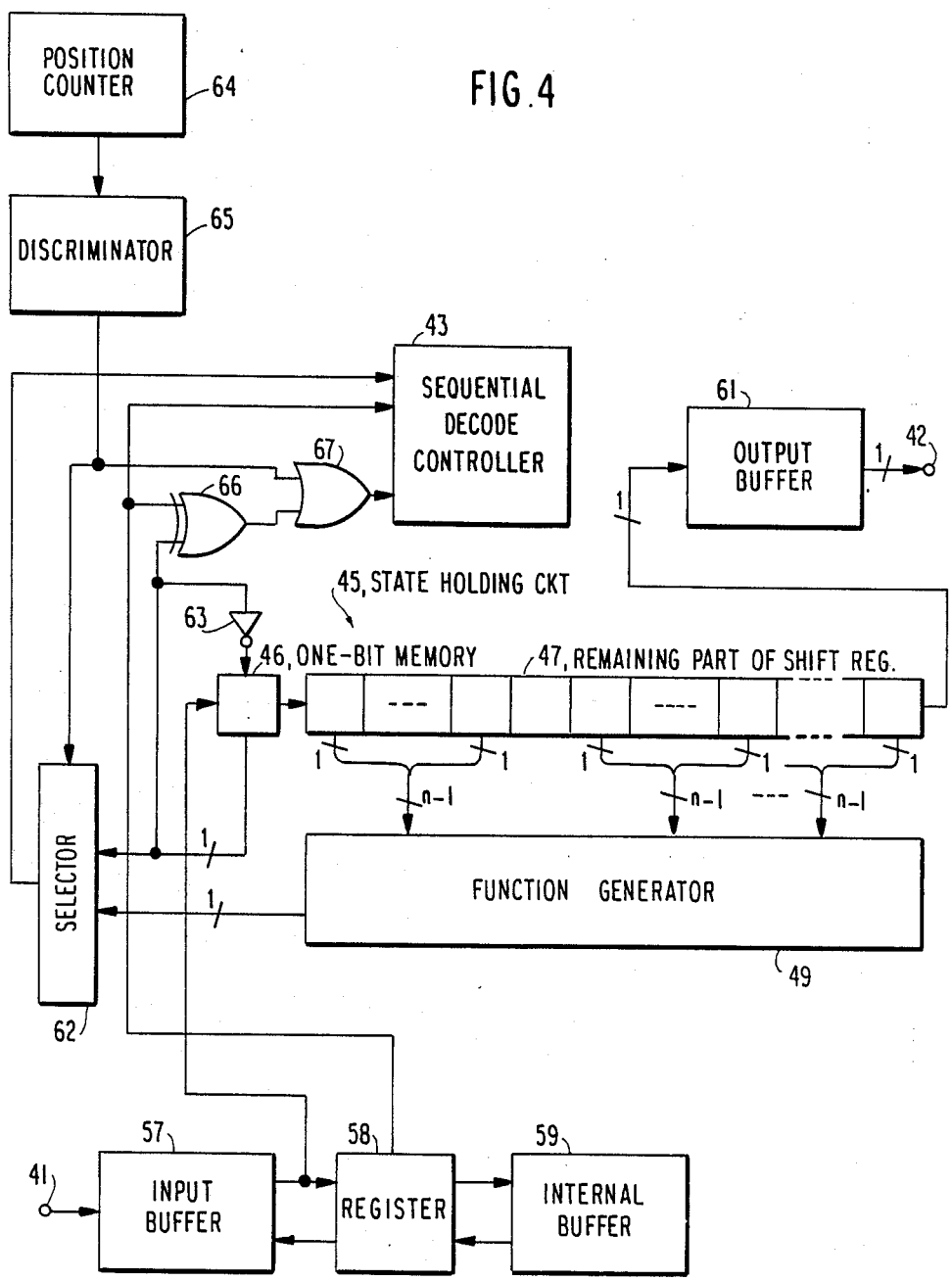
FIG. 4 is a block diagram of an error-correcting decoder according to a first more general embodiment of this invention.

Turning to FIG. 4, the description will further proceed to a decoder according to a first more general embodiment of this invention. The decoder is for use as a counterpart of the encoder illustrated with reference to FIG. 2 and comprises similar parts which are designated by like reference numerals and are operable with likely names signals. Inasmuch as the encoder of FIG. 2 produces the code symbol sequence wherein the code symbols have a common bit length of n bits, the decoder state holding circuit 45 is implemented by a single bidirectional shift register for bits which are equal in number to $n/(n-1)$ times the bits held in the encoder state holding circuit 25 (FIG. 2) at a time. The shift register may be, for example, for 96 bits. Merely for clarity of illustration, the one-bit memory 46 is depicted a little apart from the remaining part 47 of the shift register. The position counter 64 is a modulo-n $\log_2 n$-ary counter. The discriminator 65 comprises a $(\log_2 n)$-input NOR circuit (not shown) for the bit position count signal. In other respects, the decoder is similar in structure and operation to the decoder illustrated with reference to FIG. 3.

Reviewing FIGS. 3 and 4, it should be pointed out that the replica output selector 62 should select the tentatively predicted bits and the parity bits in correct synchronism with the span bits and the intermittent bits of the input code sequence. In other words, the position counter 64 should count the bit position count in correct synchronism with the input code sequence. Otherwise, the sequential decode controller 43 will find it difficult to decide whether or not the tentatively predicted bits are the information predicting bits. When such a difficulty is found, the sequential decode controller 43 will continuously produce the backward move signal. Synchronism relative to the input code sequence must thereupon be manually or otherwise corrected. Alternatively, a synchronizing signal must be supplied to the decoder at least on initially putting the decoder into operation for each input code sequence.

Figure 5:
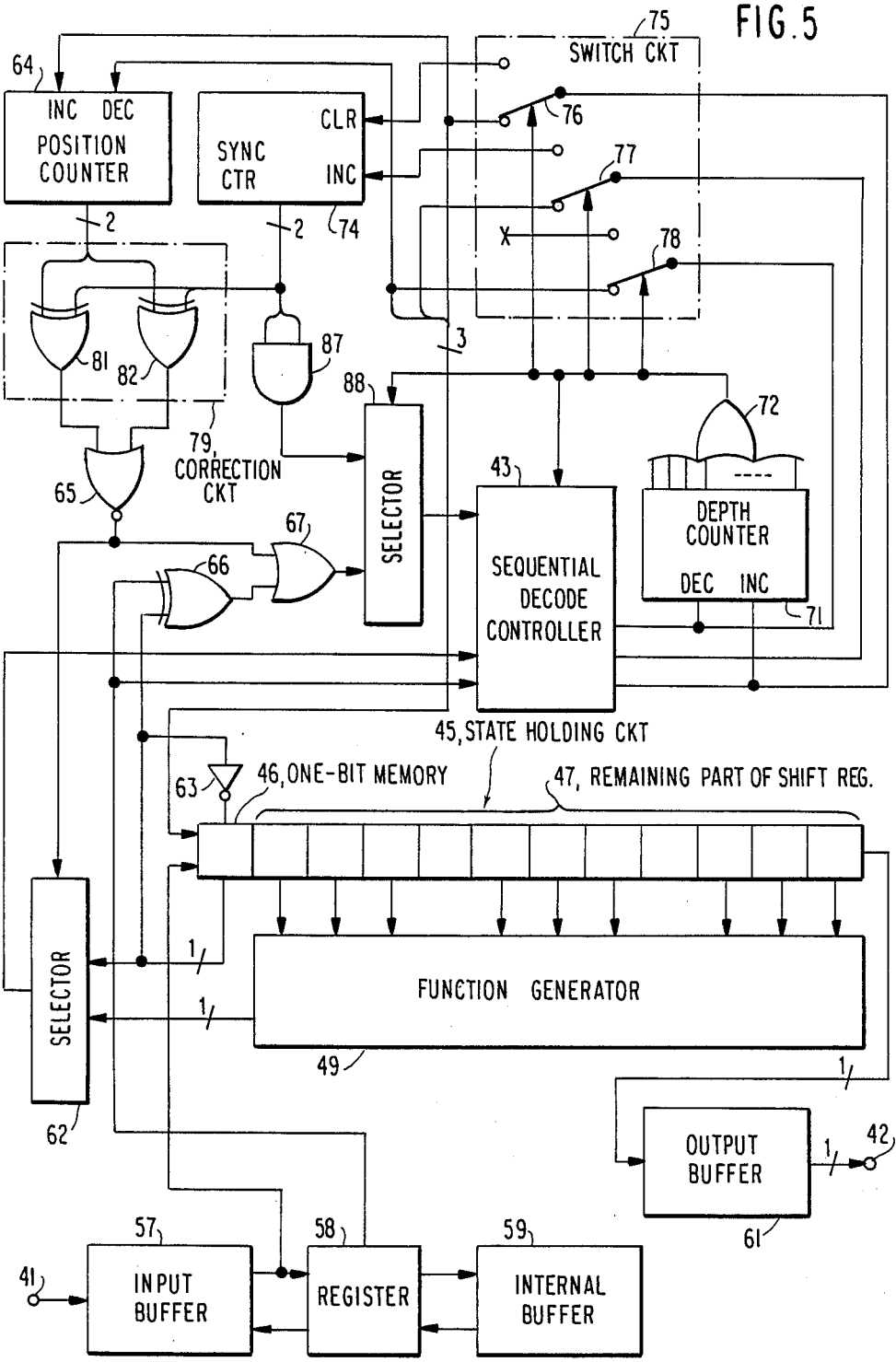
FIG. 5 is a block diagram of an error-correcting decoder according to a second specific embodiment of this invention.

Referring now to FIG. 5, the description will be directed to a decoder according to a second specific embodiment of this invention. The decoder is for use as a counterpart of the encoder illustrated with reference to FIG. 1 and comprises similar parts which are designated by like reference numerals and are operable with likely named signals. It should, however, be noted that the decoder is operable in correct synchronism relative to the input code sequence even without use of the synchronizing signal and moreover even though the synchronism is corrected neither manually nor otherwise.

In FIG. 5, the above-mentioned bus is depicted by three lines drawn from the sequential decode controller 43. In the top right-hand part of the figure, the top line of the bus is for the forward move signal. The middle line is for the lateral move signal. The bottom line is for the backward move signal. Depending on the circumstances, these signals will be called an internal move F (forward) signal, an internal move L (lateral) signal, and an internal move B (backward) signal. The reason will presently become clear why these signals are so called.

In the example being illustrated, the decoder comprises a depth counter 71 having a depth count which is given or reset to an initial or predetermined value to indicate storage, in the one-bit memory 46 of the decoder state holding circuit 45, of a leading bit of the afore-mentioned leading code among the received codes of the input code sequence. It is possible without loss of generality to select the decimal zero as the predetermined value. The depth counter 71 counts the depth count upwardly (INC) and downwardly (DEC) relative to the predetermined value in response to the internal move F and B signals and produces a binary output signal which represents the depth count by a plurality of binary bits. The binary output signal may have more than a dozen of bits.

Responsive to the binary bits of the binary output signal, a multi-input OR circuit 72 produces a depth count signal representative of the depth count. It is sufficient for the depth count signal to discriminate merely the predetermined value from other plus and minus values and thereby the leading bit from other bits of the input code sequence as by a logic zero bit and a logic one bit. The depth count signal is fed back to the sequential decode controller 43 to suspend delivery of the internal move F and B signals to the bus only when the depth count signal represents the predetermined value. It will readily be possible for one skilled in the art to modify the sequential decode controller of the prior art to be operable in this manner. At any rate, the depth counter 71 neither counts up nor down the depth count only when the leading bit is memorized in the one-bit memory 46.

A synchronism shift counter 74 has a synchronism shift count and produces a synchronism shift count signal representative of the synchronism shift count. A predetermined shift count, such as the decimal zero, is selected as the predetermined shift count to indicate the fact that the bit position count is variable in correct synchronism relative to the input code sequence and consequently that the replica output selector 62 is operable in the correct synchronism. In the manner which will become clear as the description proceeds, the synchronism shift count indicates an amount of shift of synchronism between the bit position count and storage of the consecutive bits in the one-bit memory 46 or between operation of the replica output selector 62 and delivery of bits in the input circuit comprising the input buffer 57, the register 58, and the internal buffer 59.

When the encoder produces the code symbol sequence wherein the code symbols have a common bit length of four bits, the synchronism shift counter 74 may count up to three from zero. When the code symbols have a common bit length of n bits in general, the synchronism shift counter 74 may count up to (n−1) from zero. In either event, the synchronism shift count of the predetermined value indicates the leading bit of the leading code.

A switch circuit 75 comprises first through third switch units 76, 77, and 78 which are controlled by the depth count signal. In the manner which will be described in the following, the switch units 76 through 78 are for deriving from the internal move F, L, and B signals the forward, the lateral, and the backward move signals described before.

Only when the depth count signal represents the predetermined value, namely, when the decoder deals with the leading bit, the first switch unit 76 delivers the internal move F signal to the synchronism shift counter 74 to clear (CLR) the synchronism shift count to the predetermined shift count. The second switch unit 77 delivers the internal move L signal to the synchronism shift counter 74 for count up (INC) of the synchronism shift count. The third switch unit 78 delivers to nowhere the internal move B signal supplied thereto.

Only when the depth count signal does not represent the predetermined value, namely, when the decoder deals with other bit positions of the input code sequence, the first switch unit 76 delivers the internal move F signal to the position counter 64 for count up (INC) of the bit position count and to the one-bit memory 46 so that each tentatively predicted bit be regarded as an information predicting bit. The first switch unit 76 moreover delivers the internal move F signal to the remaining part 47 of the single bidirectional shift register for the forward shift and to the input circuit for the forward delivery. The second switch unit 77 delivers the internal move L signal to the one-bit memory 46 for substitution of the inverted bit for the tentatively predicted bit and thereby for correction of the tentatively predicted bit into an information predicting bit. The third switch unit 78 delivers the internal move B signal to the position counter 64 for count down (DEC) of the bit position count. Furthermore, the third switch unit 78 delivers the internal move B signal to the remaining part 47 and the one-bit memory 46 of the decoder state holding circuit 45 for the backward shift and to the input circuit for the backward delivery.

A correction circuit 79 is for producing an output signal which is for use in controlling the replica output selector 62 through the discriminator 65 in the manner described above so that the replica output selector 62 be kept in the correct synchronism relative to the input code sequence. The output signal is therefore equivalent to the bit position count signal described before. The position counter 64 will not be said to have subsidiary position count and to produce a subsidiary position count signal representative of the subsidiary position count. In the manner described hereinabove, the subsidiary position count should be congruent with the above-mentioned predetermined position count modulo the number of bits which each code symbol or each received code has. A combination of the synchronism shift counter 74, the depth counter 71, the multi-input OR circuit 72, and the switch circuit 75 may be called a synchronism shift counting circuit. Another combination of the position counter 64, the synchronism shift counting circuit, and the correction circuit 79 may be termed a bit position counting circuit.

Responsive to the subsidiary position count signal and the synchronism shift count signal, the correction circuit 79 corrects the subsidiary position count into the bit position count in response to the synchronism shift count to produce the bit position count signal. When the synchronism shift count is equal to the predetermined shift count, the bit position count is equal to the subsidiary position count.

More particularly, the correction circuit 79 comprises first and second Exclusive OR circuits 81 and 82 in the example being illustrated. In the manner described above, each of the subsidiary position count signal and the synchronism shift count signal is given by a first and a second binary bit. Responsive to the first binary bits of the respective signals, the first circuit 81 produces a first output bit. Responsive to the second binary bits of the respective signals, the second circuit 82 produces a second output bit. The first and the second output bits are collectively used as the bit position count signal.

It is to be noted in conjunction with the foregoing that the synchronism shift count indicates the position of the respective intermittent bits in the input code sequence whenever the synchronism shift count becomes equal to the predeterimed shift count less one, namely, when each of the first and the second binary bits thereof has a binary one value. In this event, correction of the erroneous bit is meaningless. The lateral impossible detecting circuit therefore comprises an AND circuit 87 responsive to the first and the second binary bits of the synchronism shift count signal for producing a first internal impossible signal which indicates by a binary one value that the correction is meaningless. The lateral impossible signal produced by the OR circuit 67 will be named a second internal impossible signal.

An internal impossible selector 88 is controlled by the depth count signal. For delivery to the sequential decode controller 43, the lateral impossible selector 88 produces the lateral impossible signal by selecting the first and the second internal impossible signals when the depth count is equal to the predetermined value and otherwise, respectively.

The decoder is operable on the principles which will shortly become clear. In the manner described midway during progress of the description with reference to FIG. 3, it is presumed for the decoder of FIG. 5 that the information symbols have different bit lengths, such as a one-bit length and a zero-bit length, in the input code sequence. The position counter 64 is used in deciding positions of such information symbols in the input code sequence. It is therefore possible to keep the synchronism in correct order relative to the input code sequence by directly adjusting the subsidiary position count.

The synchronism shift counter 74 keeps the synchronism shift count indicative of an amount of shift in the synchronism. On adjusting the synchronism, the subsidiary position count is not directly adjusted but indirectly by the synchronism shift count through the correction circuit 79. As described, the correction circuit 79 produces the bit position count signal which represents the predetermined position count for the positions of the respective intermittent bits in the input code sequence. Otherwise, the bit position count signal indicates the positions of the respective span bits. Adjustment of the synchronism shift count is equivalent to adjustment of the bit position count. It is therefore possible to achieve correct synchronism by adjustment of the synchronism shift count.

In this manner, the synchronism is adjusted not by direct adjustment of the subsidiary position count but indirectly through adjustment of the synchronism shift count. This is because it is necessary during adjustment of the synchronism to know how much the subsidiary position count is count up (INC) or down (DEC). For this purpose, it may be possible, without correcting the subsidiary position count into the bit position count by the synchronism shift count, but to count up and down the subsidiary position count concurrently with count up (INC) and down of the synchronism shift count. It is, however, impossible with this method to protect the subsidiary position count against a count error. This method is undesirable because the count error will remain uncorrected once such a count error occurs.

It will be assumed that the code symbols for the received codes have a common bit length of n bits. The adjustment of the synchronism shift count is carried out by regarding the synchronism shift count as representative of information symbols which have the different bit length in the input code sequence. More specifically, it is regared that the information symbol has a bit length of $(n+\log_2 n)$ bits in the leading code of the received codes with an additional bit length of $\log_2 n$ bits added before the leading bit. It should clearly be understood that the additional bit length is not present in fact but is merely representative of synchronism information as will become clear as the description proceeds.

In the decoder under consideration, the synchronism information is supposed at first to represent zero, namely, correct synchronism. In response, the synchronism shift count is cleared or reset (CLR) to the predetermined shift count. Execution of the sequential decoding algorithm is started at once for the synchronism information. If the synchronism inforamtion were incorrectly supposed to be zero, the sequential decode controller 43 will find it difficult to decide whether or not the tentatively predicted bits are the information predicting bits. Under the circumstances, the sequential decode controller 43 produces the internal move B signal. this shows that the reset of the synchronism shift count to the predetermined shift count was incorrect. The internal move L signal follows and is used in counting up the synchronism shift count.

The synchronism will be corrected by correction of the subsidiary position count by the increasing synchronism shift count to provide an increasing bit position count in due course until the synchronism shift count and consequently the bit position count is increased by $n-1$. It is, however, necessary to use the depth counter 71 and the switch circuit 75 in order to correct the synchronism. The depth count of the predetermined value may be used in keeping the depth count at the predetermined value during correction of the synchronism by making the sequential decode controller 43 deliver the internal move L signal alone to the bus in the meanwhile. The switch circuit 75 is used in clearing the synchronism shift counter 74 at first and, if necessary, to count up the synchronism shift count.

Unless the depth count is equal to the predetermined value, the switch circuit 75 is switched to deliver the internal move F, L, and B signals to the position counter 64, the one-bit memory 46 and the remaining part 47 of the decoder state holding circuit 45, and the input circuit comprising the input buffer 57, the register 58, and the internal buffer 59. In this manner, the synchronism is adjusted by regarding the synchronism shift count as an information symbol of the input code sequence and decoding the synchronism shift count. After the synchronism is put into correct order, the decoder is operable like the decoder illustrated with reference to FIG. 3.

Figure 6:
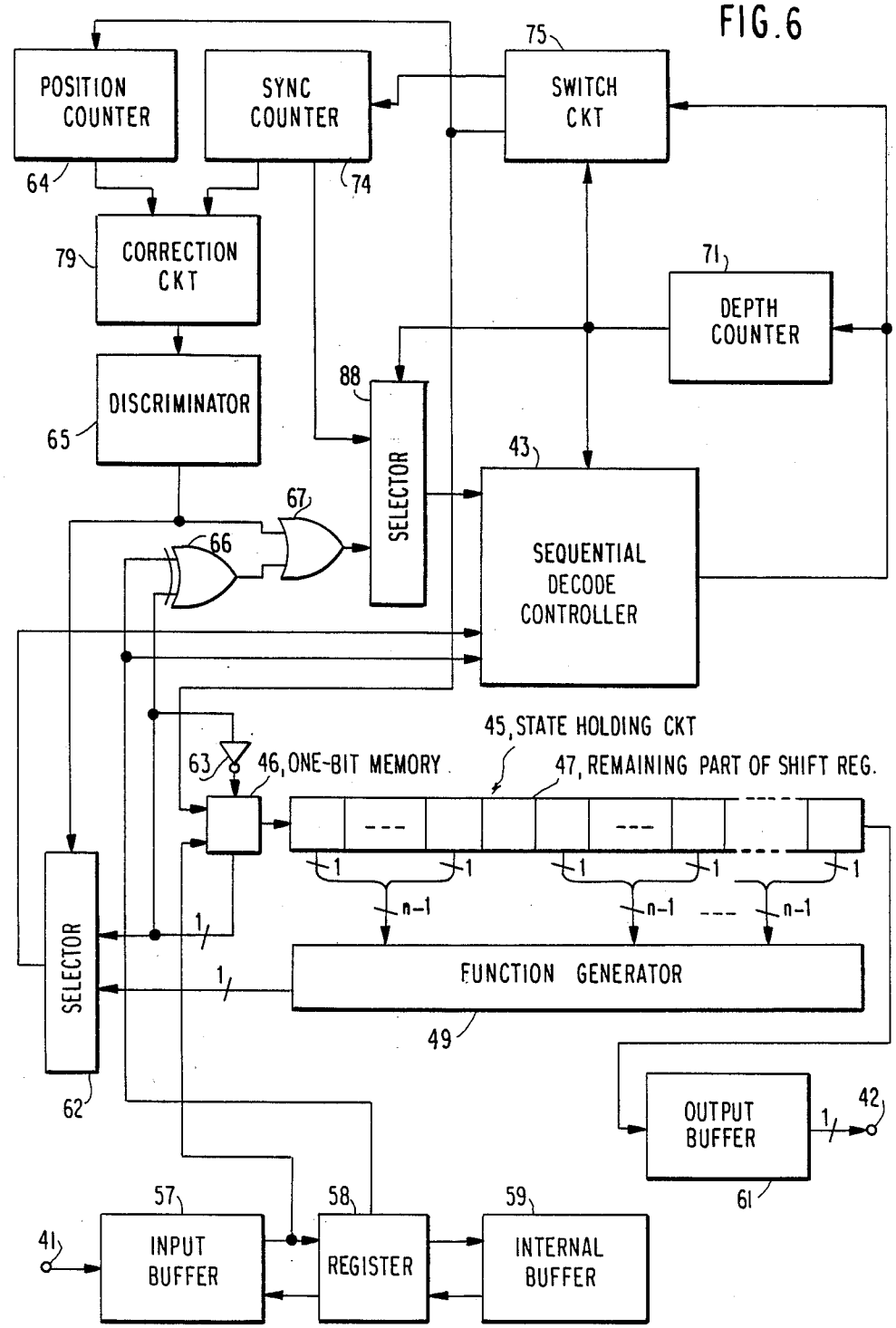
FIG. 6 is a block diagram of an error-correcting decoder according to a second more general embodiment of this invention.

Turning to FIG. 6, the description will proceed to a decoder according to a second more general embodiment of this invention. The decoder is for use as a counterpart of the encoder illustrated with reference to FIG. 2 and comprises similar parts which are again designated by like reference numerals.

In FIG. 6, the decoder state holding circuit 45 is for bits of a number which is $n/(n-1)$ times the number of bits used in the decoder state holding circuit 25 described in conjunction with FIG. 2. The bus for the internal move F, L, and B signals is depicted by a single line. The position counter 64 should be a modulo-n $\log_2$ n-ary counter. It should be understood that the depth counter 71 includes the OR circuit 72 shown in FIG. 5. The switch circuit 75 is illustrated by a single block. The synchronism shift counter 74 should be capable of counting up to $\log_2 n$. The correction circuit 79 should comprise a plurality of Exclusive OR circuits (not shown) for the subsidiary position count signal and the synchronism shift count signal. The discriminator 65 should comprise a multi-input NOR circuit in the manner described in connection with FIG. 4. The synchronism shift counter 74 should deliver the first internal impossible signal to the internal impossible selector 88 through a multi-input AND circuit which corresponds to the AND circuit 87 depicted in FIG. 5. In other respects, it will readily be possible to understand the details of the decoder illustrated in FIG. 6.

Reviewing FIGS. 3 through 6, it will now be understood that this invention provides an error-correcting bit-serial decoder. Although the systematic codes have a little inferior error correcting capability as compared with the nonsystematic codes, a high decoding speed is achieved by a decoder according to this invention to sufficiently cover the inferior error correcting capability even when the decoder is put into operation for the systematic codes. The encoder state holding circuit 25 may not necessarily be implemented by a shift register circuit but may be a circuit having an encoder internal state which is variable in a prescribed manner in response to the information symbol sequence. In this event, it is necessary that the decoder state holding circuit 45 should have a decoder internal state which is variable in correspondence to the encoder internal state.

What is claimed is:

1. In an error-correcting decoder for use as a counterpart of an error-correction encoder for encoding an information symbol sequence into a code symbol sequence which comprises said information symbol sequence and a redundancy bit sequence in accordance with a predetermined rule, said decoder comprising an encoder replica responsive to an input code sequence corresponding to said code symbol sequence for producing a replica output signal with reference to said predetermined rule and a sequential decode controller for executing a sequential decoding algorithm on said input code sequence and said replica output signal to supply said encoder replica with a control signal for use in making said encoder replica decode said input code sequence into a decoded symbol sequence which gives a reproduction of said information symbol sequence, the improvement wherein:

said encoder replica comprises:

a one-bit memory;

input means for delivering consecutive bits of said input code sequence to said one-bit memory to make said one-bit memory successively memorized said consecutive bits;

output means for producing replica output bits in response to the consecutive bits successively memorized in said one-bit memory and for delivering said replica output bits in bit series to said sequential decode controller as said replica output signal produced with reference to said predetermined rule;

said encoder replica being responsive to said control signal to produce said decoded symbol sequence in response to the consecutive bits successively memorized in said one-bit memory;

bit position counting means responsive to said control signal for counting positions of the respective consecutive bits in said input code sequence to produce a bit position count signal representative of said positions; and a discriminator responsive to said bit position count signal for producing a first and a second discrimination signal, said first discrimination signal being indicative of positions of span bits collectively corresponding in said input code sequence to said information symbol sequence, said second discrimination signal being indicative of positions of intermittent bits collectively corresponding in said input code sequence to said redundancy bit sequence;

said output means comprising a replica output selector responsive to said first discrimination signal for selecting, as tentatively predicted bits, the consecutive bits successively memorized in said one-bit memory, said replica output selector being responsive to said second discrimination signal for selecting, as parity bits, the produced bits with reference to said predetermined rule, said replica output selector being for delivering said tentatively predicted bits and said parity bits in bit series to said sequential decode controller as said replica output signal.

2. An error-correcting decoder as claimed in claim 1, wherein said bit position counting means comprises a position counter responsive to said control signal for counting the positions of the respective consecutive bits in said input code sequence to produce said bit position count signal.

3. An error-correcting decoder as claimed in claim 1, wherein said bit position counting means comprises:

a position counter responsive to said control signal for counting the positions of the respective consecutive bits in said input code sequence to produce a subsidiary position count signal representative of the positions of the respective consecutive bits;

synchronism shift counting means responsive to said control signal for counting an amount of shift in synchronism of said input code sequence to produce a synchronism shift count signal representative of said amount of shift; and a correction circuit responsive to said subsidiary position count signal and said synchronism shift count signal for correcting said subsidiary position count into said bit position count in response to said amount of shift to produce said bit position count signal.

4. An error-correcting decoder as claimed in claim 1, said consecutive bits comprising span bits and intermittent bits in accordance with said predetermined rule, said span bits collectively corresponding in said input code sequence to said information symbol sequence, said intermittent bits collectively corresponding in said input code sequence to said redundancy bit sequence, wherein:

said one-bit memory is for memorizing, one at a time, said span bits as tentatively predicted bits and said intermittent bits as dummy bits;

said output means being for producing said replica output bits in response to the tentatively predicted bits and the dummy bits memorized in said one-bit memory;

said encoder replica being responsive to said control signal to produce said decoded symbol sequence in response to the tentatively predicted bits memorized in said one-bit memory one at a time.

5. An error-correcting decoder as claimed in claim 4, wherein:

said encoder replica comprises an inverter for inverting into inverted bits the tentatively predicted bits memorized in said one-bit memory;

said sequential decode controller being for producing a forward and a lateral move signal as said control signal when the replica output bits produced in response to said tentatively predicted bits are and are not information predicting bits, respectively, said information predicting bits being predictive of bits of said information symbol sequence;

said one-bit memory being for dealing with said tentatively predicted bits as said information predicting bits when said forward move signal is produced, said one-bit memory being responsive to said lateral move signal for memorizing said inverted bits as said information predicting bits in place of said tentatively predicted bits;

said output means being for producing, as said replica output bits, the information predicting bits and the dummy bits memorized in said one-bit memory one at a time;

said encoder replica being responsive to said forward move signal to produce, collectively as said decoded symbol sequence, the information predicting bits memorized in said one-bit memory one at a time.

6. An error-correcting decoder as claimed in claim 4, said code symbol sequence being a sequence of code symbols having a predetermined number of bits in common, wherein:

said sequential decode controller is for producing a forward and a backward move signal as said control signal when the replica output bits produced in response to said tentatively predicted bits are information predicting bits predictive of bits of said information symbol sequence and when it is difficult to decide whether or not the replica output bits produced in response to said tentatively predicted bits are said information predicting bits, respectively;

said decoder further comprising:

bit position counting means responsive to said forward and said backward move signals for counting up and down a bit position count to produce a bit position count signal representative of said bit position count, said bit position count being congruent with a predetermined position count modulo said predetermined number; and a discriminator responsive to said bit position count signal for producing a first and a second discrimination signal when said bit position count is not and is equal to said predetermined position count, respectively;

said output means comprising a replica output selector responsive to said first and said second discrimination signals for selecting said tentatively predicted bits and said dummy bits as said replica output bits, respectively;

said encoder replica being for responsive to said forward move signal to produce said decoded symbol sequence in response to the tentatively predicted bits memorized in said one-bit memory one at a time.

7. An error-correcting decoder as claimed in claim 6, wherein said bit position counting means comprises a position counter responsive to said forward and said backward move signals for counting up and down said bit position count to produce said bit position count signal.

8. An error-correcting decoder as claimed in claim 6, wherein:

said sequential decode controller is for producing a lateral move signal as said control signal when the replica output bits produced in response to said tentatively predicted bits are not said information predicting bits;

said position counting means comprising:

a position counter responsive to said forward and said backward move signals for counting up and down a subsidiary position count to produce a subsidiary position count signal representative of said subsidiary position count, said subsidiary position count being congruent with said predetermined position count modulo said predetermined number;

synchronism shift counting means responsive to said lateral move signal for counting up a synchronism shift count to produce a synchronism shift count signal representative of said synchronism shift count and responsive to said forward move signal for resetting said synchronism shift count to a predetermined shift count; and a correction circuit responsive to said subsidiary position count signal and said synchronism shift count signal for correcting said subsidiary position count into said bit position count in response to said synchronism shift count to produce said bit position count signal, said bit position count being equal to said subsidiary position count when said synchronism shift count is reset to said predetermined shift count.

9. An error-correcting decoder as claimed in Claim 8, wherein said synchronism shift counting means comprises:

a synchronism shift counter responsive to said lateral move signal for counting up said synchronism shift count to produce said synchronism shift count signal and responsive to said forward move signal for resetting said synchronism shift count to said predetermined shift count;

a depth counter responsive to said forward and said backward move signals for counting a depth count upwardly and downwardly relative to a predetermined value to produce a depth count signal representative of said depth count; and a switch responsive to said depth count signal for delivering said lateral and said forward move signals to said synchronism shift counter only when said depth count signal represents said predetermined value, said switch being for delivering said forward and said lateral move signals to said one-bit memory, said forward move signal to said encoder replica, and said forward and said backward move signals to said position counter only when said depth count signal does not represent said predetermined value.

* * * * *

UNITED STATES PATENT AND TRADEMARK OFFICE
CERTIFICATE OF CORRECTION

PATENT NO. : 4,853,930

DATED : August 1, 1989

INVENTOR(S) : Shimada

It is certified that error appears in the above-identified patent and that said Letters Patent is hereby corrected as shown below:

Column 4, line 65, delete "n" and insert --$\underline{n}$--;

Column 5, line 57, delete "does" and insert --codes--;

Column 10, line 31, delete "k" and insert --$\underline{k}$--;

Column 10, line 33, delete "n bits, where n is greater than k" and insert --$\underline{n}$ bits, where $\underline{n}$ is greater than $\underline{k}$--;

Column 10, line 34, delete "k" and insert --$\underline{k}$--;

Column 10, line 35, delete "k" and isnert --$\underline{k}$--;

Column 10, line 36, delete "n" and insert --$\underline{n}$--;

Column 10, line 38, delete "k" and insert --$\underline{k}$--;

Column 10, line 56, delete "k" and insert --$\underline{k}$--;

Column 10, line 58, delete "k" and "n" and insert --$\underline{k}$-- and --$\underline{n}$--;

Column 15, line 62, delete "n" and insert --$\underline{n}$--;

Column 17, line 31, delete "n" and insert --$\underline{n}$--;

Column 19, line 47, delete "n" and insert --$\underline{n}$--; and

UNITED STATES PATENT AND TRADEMARK OFFICE
CERTIFICATE OF CORRECTION

PATENT NO. : 4,853,930

DATED : August 1, 1989

INVENTOR(S) : Shimada

It is certified that error appears in the above-identified patent and that said Letters Patent is hereby corrected as shown below:

Column 19, line 52, delete "regared" and insert --regarded--.

Signed and Sealed this

Twelfth Day of November, 1991

Attest:

HARRY F. MANBECK, JR.

*Attesting Officer*    *Commissioner of Patents and Trademarks*